United States Patent [19]

Micic et al.

[11] Patent Number: 4,959,721
[45] Date of Patent: Sep. 25, 1990

[54] REMOTE CONTROL SYSTEM WITH MENU DRIVEN FUNCTION SELECTION

[75] Inventors: Ljubomir Micic, Freiburg; Peter M. Flamm, March-Buch-heim, both of Fed. Rep. of Germany

[73] Assignee: Deutsche ITT Industries GmbH, Freiburg, Fed. Rep. of Germany

[21] Appl. No.: 380,401

[22] Filed: Jul. 17, 1989

[30] Foreign Application Priority Data

Aug. 6, 1988 [EP] European Pat. Off. ...... 88112829[U]

[51] Int. Cl.$^5$ .............................................. H04N 5/44
[52] U.S. Cl. .................... 358/194.1; 358/210; 340/709; 340/712; 340/706; 340/825.69
[58] Field of Search ............... 358/194.1, 173.1, 210; 340/709, 700–720, 825.69; 388/242, 22; 273/312, DIG. 28, 313

[56] References Cited

U.S. PATENT DOCUMENTS

| | | | |
|---|---|---|---|
| 4,017,680 | 4/1977 | Anderson et al. | 358/242 |
| 4,210,329 | 7/1980 | Steiger et al. | 273/313 |
| 4,392,022 | 7/1983 | Carldson | 388/194.1 |
| 4,565,999 | 1/1986 | King et al. | 340/709 |
| 4,626,892 | 12/1986 | Nortrup et al. | 358/22 |
| 4,796,019 | 1/1989 | Auerbach | 340/709 |
| 4,825,209 | 4/1989 | Sasaki et al. | 358/194.1 |

FOREIGN PATENT DOCUMENTS 2653113 10/1977 Fed. Rep. of Germany .
2162978 2/1986 United Kingdom .

OTHER PUBLICATIONS

Yoshikazu Tsuboi et al., "Microcomputer-Based Remote Control System for TV Receivers", IEEE Transactions on Consumer Electronics, vol. CE-25, Nov. 1979, pp. 731–739.
Philips Magazine, Feb., 1988, p. 21, Brussel, Belgium.

*Primary Examiner*—Howard W. Britton
*Assistant Examiner*—Michael Lee
*Attorney, Agent, or Firm*—Thomas L. Peterson

[57] ABSTRACT

A remote control system, particularly for television sets, includes a remote control receiver and a remote control transmitter. The receiver and transmitter are switched to the menu mode by means of a menu key. At least two menu fields are associated with the remote control receiver and are displayed on the screen of the television set. The menu fields are individually selectable by means of the remote control transmitter. The selection is preferably accomplished by manually aligning the remote control transmitter with the displayed menu field to be selected.

7 Claims, 2 Drawing Sheets

REMOTE CONTROL SYSTEM WITH MENU DRIVEN FUNCTION SELECTION

BACKGROUND OF THE INVENTION

1. Field of the Invention

The present invention is in the field of electronic remote control devices for operating equipment at a distance.

2. Description of the Related Art

The present invention is specifically related to remote control systems that include a remote control transmitter having a transmitting device for remote control signals, an encoder circuit, and manual control elements. Such remote control systems further include a remote control receiver having a receiving device for remote control signals and a decoder circuit. Such remote control systems are used for industrial applications (e.g., to control cranes), but are also increasingly being used in the private sector (e.g., as simple garage door control systems or sophisticated remote control systems for television sets, or the like).

In Yoshikazu Tsuboi, et al., "MICROCOMPUTER-BASED REMOTE CONTROL SYSTEM FOR TV RECEIVERS," *IEEE Transactions on Consumer Electronics*, Vol. CE-25, November 1979, pp. 731-739, a remote control system is described which can deliver sixteen different commands for controlling a television receiver. The control signals are conveyed by infrared light. The remote control transmitter includes a keyboard comprising sixteen keys, a microcomputer used as an encoder circuit and a transmitting device containing a light-emitting diode ("LED"). The depression of one of the keys on the keyboard initiates the transmission of an encoded sequence of infrared light pulses. The light pulses are received by the remote control receiver in the television set by means of a receiving device that includes PIN photodiode. Immunity to interfering signals at the receiver is achieved by optical filters, selective amplification, averaging, and a Schmitt trigger circuit following the averaging device. The output of the Schmitt trigger is coupled to a microcomputer for decoding the received signals. The microcomputer delivers individual control signals (e.g., for channel selection).

A disadvantage of such remote control systems is the direct assignment of each remote control command to a single control key, because the number of keys increases with the number of control functions. Multiple use of the keys is unsatisfactory, too, because the tradeoff for the smaller number of keys is potential ambiguity and more complicated command entry. In addition, because of the small size of the usually hand-held remote control transmitter, it is hardly possible to represent the individual functions by symbols, even less so if the keys are used for multiple functions. In the case of television receivers, the operation of the transmitter is complicated by the fact that the environment is relatively dark, which makes it even more difficult to discern small unlit symbols.

SUMMARY OF THE INVENTION

The present invention provides an improved remote control system which is simple to operate. This simplicity in operation is attained by applying menu control to the remote control system. Such menu control is commonly used in data processing equipment, and employs a cursor whose movement is controlled, for example, by a "mouse." When applied to the remote control system described herein, the individual menu fields offered for selection are selectable via the remote control transmitter.

A menu offers the user of data processing equipment a selection of commands from which he or she selects the desired command. The commands are generally displayed on the screen line by line and one below the other, with the desired command having to be selected by the operator by means of the cursor. Upon depression of the execute key, the command is executed. It is advantageous that the choice of commands can be displayed on the screen in a brief description, which would be impossible in a keyboard.

In data-processing equipment, menu control is performed in the same programming language as input of commands. Separate menu control is not appropriate there. In remote control systems, however, separate menu control may be quite useful, as at least one embodiment of the invention illustrates, but in most cases a combination of key and menu control is preferred.

BRIEF DESCRIPTION OF THE DRAWINGS

The invention will now be explained in greater detail with reference to the accompanying drawings, in which.

DETAILED DESCRIPTION OF THE PREFERRED EMBODIMENTS

Figure 1:
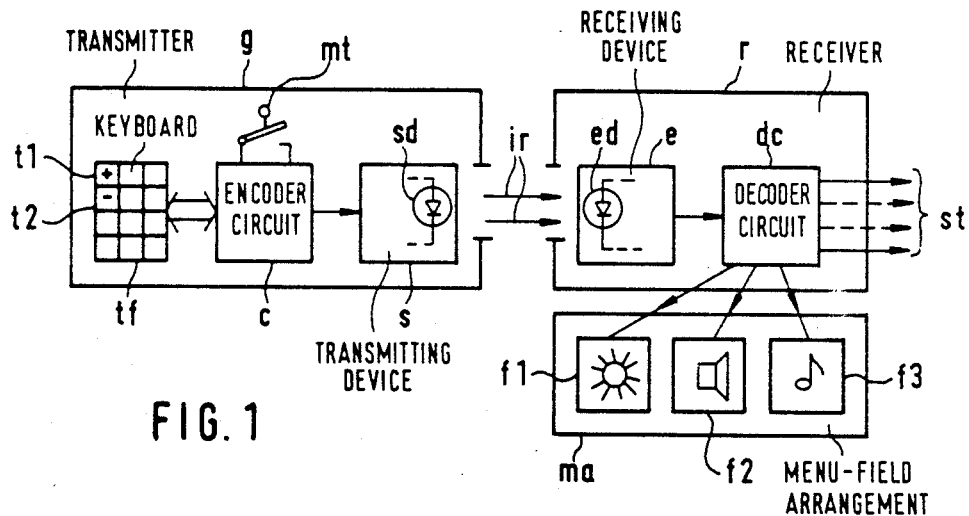
FIG. 1 is a block diagram of an embodiment of the invention, showing a remote control transmitter and a remote control receiver which delivers control commands and controls a menu-field arrangement.

A remote control transmitter g is shown schematically in FIG. 1. The remote control transmitter g includes a keyboard tf. A key depression on the keyboard g is encoded into a pulse sequence by means of an encoder circuit c in the usual manner and fed to a transmitting device s. The transmitting device s contains an infrared-emitting diode sd, which transmits the encoded key signals (i.e., pulse sequences) as optical remote control signals ir to a remote control receiver r.

The remote control receiver r contains at its input a receiving device e. The receiving device e includes an infrared photodiode ed which converts the remote control signals ir into electric signals. The electric signals are translated into various control commands st by a decoder circuit dc. The decoder circuit dc is also connected to various menu fields f1, f2, f3 lying within a menu-field arrangement ma.

The remote control transmitter g includes a menu key mt connected to the encoder circuit c. By activating the menu key mt, the encoder circuit c generates a particular pulse sequence which is communicated to the receiver r via the remote control signals ir. The pulse sequence causes the receiver r to switch to the menu mode. In the menu mode, the control functions represented in the menu fields by symbols are offered to the operator for selection. According to the cursor function, the selected menu field begins to blink or stands out against the other menu fields in some other manner. If, for example, readiness for a brightness change is indicated by a blinking sun symbol in the first menu field f1, but a volume change is desired, the second menu field f2 can be selected by depressing the menu key again, thereby activating the readiness for a volume change. The desired volume change can then be initiated by means of an up (plus) key t1 and a down (minus) key t2 on the keyboard tf.

The change of the menu fields f1, f2, f3 may also be effected via direction keys, via a miniaturized joystick, via a ball or mouse control, or via some other mechanical control device in conjunction with the encoder circuit c.

Termination of the menu control is effected, for example, by prolonged depression of the menu key mt or by selection of a menu-off field (not shown). Automatic termination of the menu mode is also achieved by arranging that after a predetermined period of time in which the menu key mt is not operated, the menu mode is automatically switched off.

Figure 2:
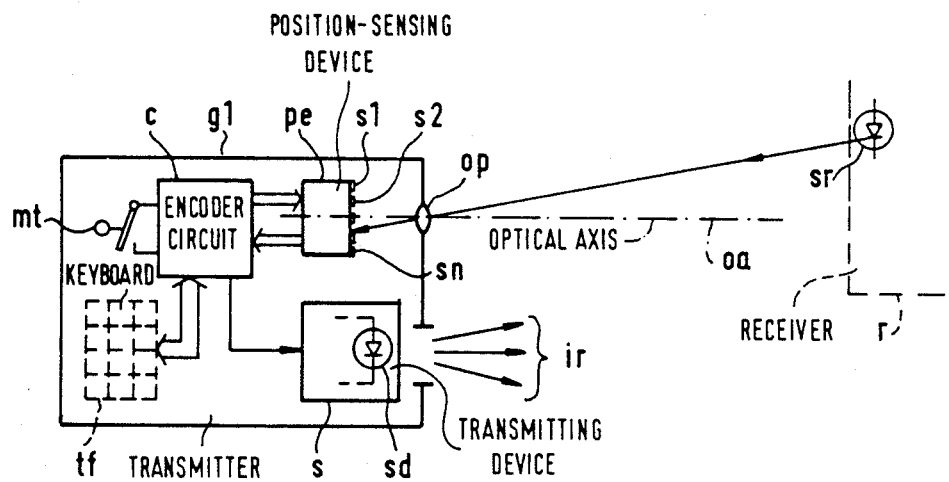
FIG. 2 is a block diagram of another remote control transmitter which contains a device for sensing its relative position with respect to the remote control receiver.

FIG. 2 shows schematically how in an alternative embodiment of a remote control transmitter g1 according to the invention, a position-sensing device pe is used for menu control purposes. In this embodiment, the receiver r includes an infrared-emitting signal source sr. The signal from the infrared-emitting signal source sr is communicated to the position-sensing device pe via a lens op. The alignment of the lens op with the position-sensing device pe defines an optical axis oa. The relative position of the infrared-emitting signal source sr in the remote control receiver r with respect to the optical axis oa is evaluated. The signal source sr is imaged by the lens op onto the position-sensing device pe. The position-sensing device pe has a sensing face which is divided into n sensing elements s1, s2 ... sn. The number n is equal to the number of menu fields in the associated menu-field arrangement (not shown in FIG. 2), and the arrangement of the sensing elements s1, s2 ... sn corresponds to that menu-field arrangement.

The activated sensor element s1, s2 ... sn produces a drive signal for the transmitting device s by means of the encoder circuit c. The remote control signals ir emitted by the transmitting diode sd thus contain coded information as to which of the n sensor elements s1, s2 ... sn has been activated.

The control provided by this direction dependence simplifies the selection of the desired control functions. For many remote control tasks, the keyboard tf, shown in FIG. 2 by broken lines, can therefore be dispensed with. By means of the menu key mt connected to the encoder circuit c, the function "blinked at" can then be initiated. Each of the up and down keys t1, t2 of FIG. 1 is then replaced by a separate menu field.

The direction determination and the evaluation of the direction dependence can also be performed by means of a suitable evaluating circuit in the remote control receiver, for example, by associating with each of the menu fields a sensing diode which can be blinked at by a selective infrared pulse from the remote control transmitter. Another possibility of evaluating the direction dependence is described in published German Application DT No. 26 53 113, corresponding to U.S. Pat. No. 4,210,329, which shows a video-game arrangement in which a light spot moving on the screen is to be shot down by means of an optoelectronic target detector. The output of the target detector is transmitted to the television receiver without the use of wire, and fed there to an evaluating circuit.

Figure 3:
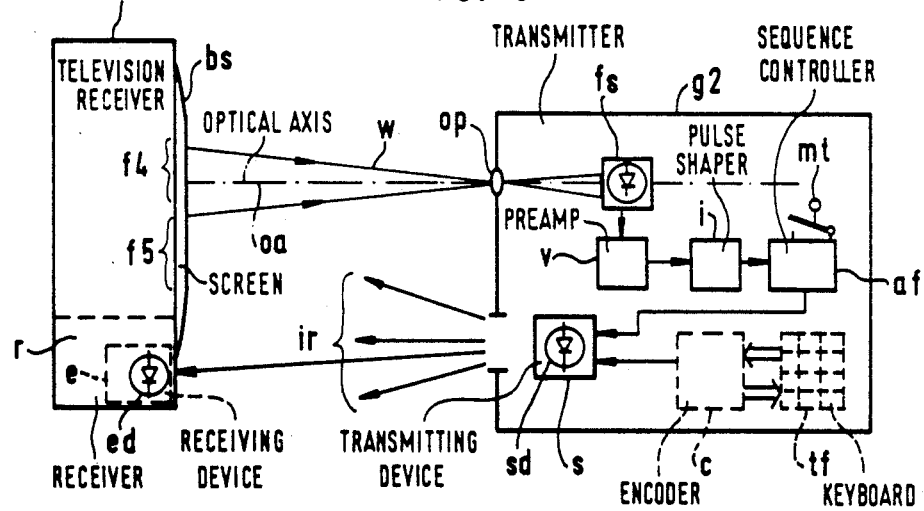
FIG. 3 is a block diagram of another, likewise position-dependent embodiment of the remote control system in which the remote control receiver is part of a television receiver.

FIG. 3 shows a block diagram of a further embodiment of the remote control system according to the invention, which is linked with a television receiver tv having a screen bs. In this embodiment, too, the relative position of a remote control transmitter g2 with respect to a remote control receiver r and, thus, to the television receiver tv is evaluated for menu control purposes. At least parts of the screen bs are used to represent different menu fields. These menu fields, which may advantageously represent the individual functions by symbols, are generated by means of a character generator in the television receiver tv. In FIG. 3, two menu fields f4, f5 are shown schematically on the screen bs.

The remote control transmitter contains a photosensitive receiving device fs which responds if suitably aligned with the menu fields f4, f5 shown on the screen bs. The field of view is only a small solid angle w in the direction of the optical axis oa determined by the direction of the photosensitive receiving device fs and the lens op. The solid angle w is chosen so that at the normal television viewing distance, not more than a single menu field f4, f5 will be covered. At too small a solid angle w, however, the control becomes unreliable.

The electric signals formed by the photosensitive receiving device fs are amplified in a selective preamplifier v and then fed to a pulse shaper i, which is followed by a sequence controller af. The sequence controller af is a simple encoder circuit. In the simplest case, the sequence controller af contains an electronic switch which is operated by the menu key mt. When the menu key mt is closed, the signals received by the photosensitive receiving device fs are thus passed to the transmitting device s and, hence, to the transmitting diode sd. The transmitting diode sd produces the remote control signals ir, which are received and evaluated by the remote control receiver r. For example, in response to particular signals, a cursor, generated by the character generator with the television receiver tv, is moved to the associated position on the screen bs.

In a preferred embodiment, however, the menu key mt in conjunction with the sequence controller af does not act as pure switch because in that case, the positional information is available only during the operation of the menu key mt. Rather, the operation of the menu key mt only modifies the remote control signal ir, and this modification is reliably recognized as such in the remote control receiver r without interfering with the positional information. This is achieved in a simple manner by arranging, for example, that upon depression of the menu key mt, the sequence controller af delivers a pulse sequence of a defined, different frequency to the transmitting device s, and that the remote control receiver r contains means for recognizing this pulse sequence.

In FIG. 3, as indicated by broken lines in the remote control transmitter a key control using a keyboard tf and an encoder circuit c can be added to the menu control.

Figure 4:
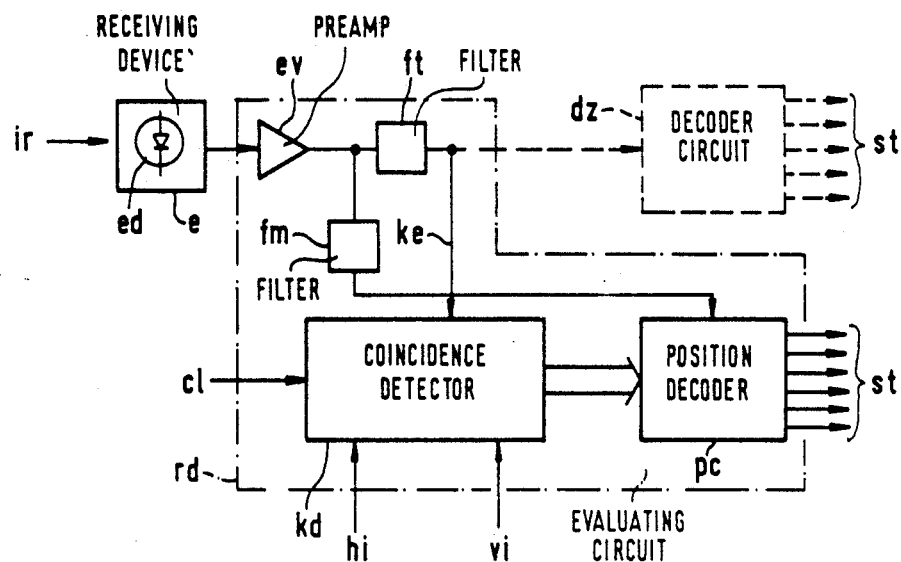
FIG. 4 is a block diagram showing the generation of the position-dependent control signals in the remote control receiver of FIG. 3.

FIG. 4 shows schematically in a block diagram how the received remote control signals ir are evaluated in the remote control receiver r of FIG. 3 by means of an evaluating circuit rd. The received remote control signals ir are converted by the receiver diode ed in the receiving device e into electric signals which are amplified in a preamplifier ev and filtered in a filter circuit ft connected to the output of the preamplifier ev. The filter circuit ft passes essentially only signals of horizontal frequency and suppresses the DC components and AC components of the ambient lighting.

The menu fields f4 . . . , represented as raster scan-line patterns, as illustrated, for example, in FIG. 3, produce remote control signals ir which also contain the characteristic horizontal frequency. This is used to evaluate the selected menu field f4 . . . , and, thus, the respective screen position by feeding the output of the filter circuit ft to a coincidence detector kd as an input signal ke. The coincidence detector kd is also fed with horizontal pulses hi and vertical pulses vi from the screen controller of the tv. The coincidence detector kd senses the time relationship of the occurrence of its input signal ke to the horizontal sweep.

The coincidence detector kd contains two counters, for example, that are driven by a counter clock signal cl. The first of these counters is set to zero and started by the horizontal pulse hi, and the second by the vertical pulse vi. The respective counting process is stopped by the coincidence detector input signal ke, and the respective count is fed to a position decoder pc. Advantageously, the counter clock signal cl is locked to the clock signal of the above-mentioned character generator. From the count transferred to it, the position decoder pc determines which of the menu fields is being pointed to by the optical axis oa of the remote control transmitter g2, and provides an associated control command st, which moves the cursor, if shown, or causes the respective menu field to blink.

If a key control is used in addition to the menu control, the output of the filter circuit ft will be fed to an additional decoder circuit dz, which selects an associated control command st according to the associated pulse sequence. The preamplifier ev is also connected via an additional filter circuit fm to the position decoder pc in order to trigger that control signal st which is assigned to the pulse sequence triggered by the menu key mt for selecting the respective menu field.

For better interference suppression, the position decoder pc may be designed so that the correct signal must be offered to it several times before it triggers a control command st. This permits the use of a release circuit (not shown) which releases the control command st only if the respective menu field has been selected frequently enough. This can be determined by means of an up/down counter.

In each of the embodiments illustrated in FIGS. 1 to 3, only a single menu key mt is shown. Further embodiments of the remote control system (not shown) have not just one menu key mt, but two or more, in which case control commands belonging together are selectable by means of one menu key associated therewith. Television receivers, for example, may have a menu key for channel selection, a menu key for brightness control, a menu key for color-saturation control, and a menu key for volume control, the respective adjustment being made in all four cases by means of a common up or down key or a common up or down menu field.

If two or more pictures are displayed on the television screen, channel selection in the menu mode is very user-friendly, since the user only needs to point the remote control transmitter g1 or g2 to the respective program field of interest, which is also a menu field f4 . . . . With the menu key mt, the small picture being displayed in the respective menu field f4 . . . can then be selected as the main program, i.e., displayed on the screen bs in full size.

What is claimed is:

1. A remote control system comprising:
   a remote control transmitter having a transmitting device that transmits remote control signals, an encoder circuit that controls the signals transmitted by said transmitting device, and manual control elements that control said encoder circuit; and
   a remote control receiver having a receiving device that receives said remote control signals and a decoder circuit that decodes said received remote control signals, said remote control receiver further comprising a signal source that generates a positioning signal that is directed toward said remote control transmitter;
   wherein said remote control transmitter comprises at least one menu key, which, when activated causes said encoder and said transmitting device to transmit a predetermined remote control signal to said remote control receiver to cause said remote control receiver to switch to a menu mode, said remote control receiver causing at least first and second menu fields to be displayed in said menu mode, said first and second fields being individually selectable in response to further remote control signals from said remote control transmitter such that a selected one of said first and second menu fields is indicated visually, said remote control transmitter further comprising a position-sensing device having a plurality of sensing elements which are selectively activated by said positioning signal generated by said signal source when aligned with said positioning signal, said position-sensing device generating an output signal responsive to the activation of one of said sensing elements to cause said encoder to generate a remote control signal identifying said one of said sensing elements to select one of said first and second menu fields; and
   wherein when said manual control elements of said remote control transmitter are activated while said remote control receiver is in said menu mode, a remote control signal is transmitted to said remote control receiver to cause said remote control receiver to generate a control command assigned to the visually indicated menu field.

2. The remote control system as defined in claim 1, wherein said remote control receiver further comprises an evaluating circuit, and wherein a selected one of said first and second menu fields is determined by manual alignment of said remote control transmitter with respect to said remote control receiver, the alignment of said remote control transmitter with respect to said remote control receiver being continuously evaluated in said remote control receiver by said evaluating circuit.

3. A remote control system comprising:
   a remote control transmitter having a transmitting device that transmits remote control signals, an encoder circuit that controls the signals transmitted by said transmitting device, and manual control elements that control said encoder circuit; and
   a remote control receiver having a receiving device that receives said remote control signals and a decoder circuit that decodes said received remote control signals, said remote control receiver being part of a television receiver having a screen that displays visual information;

wherein said remote control transmitter comprises at least one menu key, which, when activated causes said encoder and said transmitting device to transmit a predetermined remote control signal to said remote control receiver to cause said remote control receiver to switch to a menu mode, said remote control receiver causing at least first and second menu fields to be displayed on said screen of said television receiver in said menu mode, said first and second fields being individually selectable in response to further remote control signals from said remote control transmitter such that a selected one of said first and second menu fields is displayed in a manner that is visually distinguishable from the nonselected field, said first and second menu fields being spaced apart on said screen by a distance such that the first and second menu fields have a minimum solid angle therebetween at a normal television viewing distance;

wherein when said manual control elements of said remote control transmitter are activated while said remote control receiver is in said menu mode, a remote control signal is transmitted to said remote control receiver to cause said remote control receiver to generate a control command assigned to the visually indicated menu field;

wherein said remote control transmitter comprises:
a photosensitive receiving device having a field of view that is a solid angle in the direction of an optical axis which, at a normal television viewing distance, is not greater than said minimum solid angle between said first and second menu fields, said photosensitive receiving device generating an output signal responsive to the horizontal and vertical position of said selected one of said first and second menu fields;
a selective amplifier that receives said output signal from said photosensitive receiving device and generates an amplified output signal;
a pulse shaper that receives said amplified output signal from said selective amplifier and generates an output signal; and
a sequence controller that receives said output signal from said pulse shaper and generates a control signal that is provided as an input to said transmitting device, which emits remote control signals to said remote control receiver; and wherein said remote control receiver comprises:
a coincidence detector that receives horizontal and vertical pulses corresponding to the horizontal and vertical scanning of said television receiver, and that receives a coincidence detector input signal responsive to said control signals transmitted by said remote control transmitter, said coincidence detector input signal responsive to the horizontal and vertical position of said selected one of said first and second menu fields, said coincidence detector determining a time relationship of the coincidence detector input signal with the horizontal sweep of said television set and providing a signal responsive to said time relationship as an output signal; and
a position decoder that receives said output signal responsive to said time relationship from said coincidence detector and converts said time relationship into control commands.

4. The remote control system as defined in claim 3, wherein said sequence controller is coupled with said menu key, and wherein activation of said menu key causes said signal fed to said transmitting device to be modified in such a manner that said modification is reliably recognized in said remote control receiver.

5. The remote control system as defined in claim 4, wherein said menu mode is terminated by selecting a separate menu-off field.

6. The remote control system as defined in claim 4, wherein said menu mode is terminated automatically after a predetermined period of time in which said menu key is not operated.

7. The remote control system as defined in claim 1, wherein control commands having related functions are selectable by a single menu key associated therewith.

* * * * *